US012802731B2

(12) United States Patent
Mertens et al.

(10) Patent No.: US 12,802,731 B2
(45) Date of Patent: Nov. 17, 2026

(54) STACK WITH A HIGH TUNNELING MAGNETORESISTANCE RATIO FOR A MAGNETIC RANDOM ACCESS MEMORY DEVICE

(71) Applicant: IMEC VZW, Leuven (BE)

(72) Inventors: Sofie Mertens, Wijgmaal (BE); Kiroubanand Sankaran, Herent (BE); Xiaoyu Piao, Heverlee (BE); Robert Carpenter, Kessel-lo (BE)

(73) Assignee: IMEC vzw, Leuven (BE)

( * ) Notice: Subject to any disclaimer, the term of this patent is extended or adjusted under 35 U.S.C. 154(b) by 340 days.

(21) Appl. No.: 18/587,140

(22) Filed: Feb. 26, 2024

(65) Prior Publication Data

US 2024/0290368 A1 Aug. 29, 2024

(30) Foreign Application Priority Data

Feb. 28, 2023 (EP) .................................... 23158995

(51) Int. Cl.

| | |
|---|---|
| ***H10B 61/00*** | (2023.01) |
| ***G11C 11/16*** | (2006.01) |
| ***H01F 10/32*** | (2006.01) |
| ***H10N 50/01*** | (2023.01) |
| ***H10N 50/10*** | (2023.01) |
| ***H10N 50/85*** | (2023.01) |

(52) U.S. Cl.

CPC ........ *G11C 11/161* (2013.01); *H01F 10/3272* (2013.01); *H10B 61/00* (2023.02); *H10N 50/01* (2023.02); *H10N 50/10* (2023.02); *H10N 50/85* (2023.02)

(58) Field of Classification Search

CPC .... H01F 10/3272; H10B 61/00; H10N 50/01; H10N 50/10; H10N 50/85

See application file for complete search history.

(56) References Cited

U.S. PATENT DOCUMENTS

| | | | | |
|---|---|---|---|---|
| 9,490,054 | B2 | 11/2016 | Jan et al. | |
| 2006/0176735 | A1 * | 8/2006 | Yuasa ..................... | G11C 11/16 257/E43.006 |

(Continued)

OTHER PUBLICATIONS

Extended European Search Report for EP Application No. 23158995.3 dated Aug. 30, 2023, 5 pages.

(Continued)

*Primary Examiner* — Samuel A Gebremariam

(74) *Attorney, Agent, or Firm* — Knobbe, Martens, Olson & Bear, LLP

(57) ABSTRACT

The disclosed technology generally relates to a stack for a magnetic random access memory device, for example, a stack including a magnetic tunnel junction with a high tunneling magnetoresistance ratio. In one aspect, the stack includes a substrate layer, a first electrode layer arranged on the substrate layer, and seed metal layer arranged on the first electrode layer, each layer having a [001] or [010] or [100] in-plane texture. The stack further includes a magnetic free layer arranged on the seed metal layer, a crystalline tunnel barrier layer arranged on the free layer, a magnetic reference layer arranged on the crystalline tunnel barrier layer, a pinning layer arranged on the reference layer, and a second electrode layer arranged on the pinning layer.

20 Claims, 4 Drawing Sheets

(56) References Cited

U.S. PATENT DOCUMENTS

| | | | |
|---|---|---|---|
| 2007/0258170 A1 | 11/2007 | Yuasa |
| 2017/0309301 A1 | 10/2017 | Takahashi et al. |
| 2020/0266333 A1 | 8/2020 | Park et al. |
| 2022/0130442 A1 | 4/2022 | Kalitsov et al. |

OTHER PUBLICATIONS

Ikeda et al., "Tunnel magnetoresistance of 604% at 300 K by suppression of Ta diffusion in CoFeB/MgO/CoFeB pseudo-spin-valves annealed at high temperature," *Applied Physics Letters*, 93, 082508, 3 pages (2008).

Parkin et al., "Giant tunnelling magnetoresistance at room temperature with MgO (100) tunnel barriers," *Nature Materials*, vol. 3, 862-867, (Dec. 2004).

Swerts et al., "Solving the BEOL compatibility challenge of top-pinned magnetic tunnel junction stacks," 2017 IEEE International Electron Devices Meeting (IEDM), pp. 38.6.1-38.6.4 (2017).

Wen et al., "Tunnel magnetoresistance in textured Co2FeAl/MgO/CoFe magnetic tunnel junctions on a Si/SiO2 amorphous substrate," *Applied Physics Letters*, 98, 192505, 3 pages (2011).

* cited by examiner

HR-TEM

TP (MTJ) first

BP (POR)

STACK WITH A HIGH TUNNELING MAGNETORESISTANCE RATIO FOR A MAGNETIC RANDOM ACCESS MEMORY DEVICE

CROSS-REFERENCE TO RELATED APPLICATIONS

This application claims foreign priority to European Patent Application No. EP 23158995.3, filed Feb. 28, 2023, the content of which is incorporated by reference herein in its entirety.

BACKGROUND

Technical Field

The disclosed technology generally relates to magnetic random access memory (MRAM) devices, and magnetic tunnel junctions (MTJs) employed in such MRAM devices. The disclosed technology presents a stack for an MRAM device, for example, for a spin-transfer torque (STT) MRAM device, wherein the stack includes a perpendicular or in-plane MTJ with an enhanced tunneling magnetoresistance ratio (TMR). The disclosed technology also presents an MRAM device, and a method of fabricating the stack for the MRAM device.

Description of the Related Technology

MRAM devices, for example, perpendicular STT-MRAM devices, can include a perpendicular MTJ. Typically, the MTJ can include a magnetic free layer and a magnetic fixed reference layer, which are separated by a tunnel barrier layer. The free layer of the MTJ can be used to store information, and the stored information can be read-out by determining a tunneling magnetoresistance between the free layer and the reference layer through the tunnel barrier layer. For example, the reference layer and the free layer may be made of a cobalt iron boron (CoFeB) material, and the tunnel barrier layer of magnesium oxide (MgO), in order to improve (e.g., optimize) a switching current and the TMR, respectively.

However, stacks for MRAM devices, which are based on such MTJs, deliver a TMR≤200% at a resistance area product (RA)<10 and a TMR≤250% at RA>10. The low TMR and a low RA remain the main limiting factors, for example, for STT-MRAM devices.

Therefore, a higher TMR of above 200% is desired at RA<10 to broaden its application by increasing, for instance, a write or erase margin, or to reduce read or sensing errors.

An improved crystallinity of the MgO tunnel barrier layer, as well as an improved interface quality of the layers, could increase the TMR in the above-described MTJ. However, in stacks, a high thermal budget of 400° C. and more during fabrication can still result in an undesired TMR reduction. This is, because the high thermal budget can lead to a loss of perpendicular magnetic anisotropy (PMA) in the free layer and/or the reference layer, and may also cause a significant diffusion of metal elements through the stack, which may deteriorate the properties of the free layer and/or the reference layer.

The use of a "MTJ first" approach, wherein the reference layer is arranged on top of the stack (also can be referred to as a top-pinned stack), may show some improvement. However, challenges with back end of line (BEOL) processing can exist in such a stack, for instance, due to high annealing temperatures experience by the stack.

The use of a synthetic ferromagnetic (SFM) pinning layer may provide the stack with some annealing tolerance of, for example, up to 400° C. in a top-pinned stack. This may increase the TMR, however, a TMR of 200% or more at RA<10 may still not be achieved.

SUMMARY OF CERTAIN INVENTIVE ASPECTS

In view of the above, the disclosed technology aims for an improved stack for an MRAM device, and an improved method of fabricating the stack. An objective is to reach a higher TMR in such a stack than in other stacks, in particular, a TMR of ≥200% at RA<10 and/or a TMR≥250% at RA>10. An objective is specifically to improve the TMR by a top-pinned stack design.

These and other objectives can be achieved by the solution of the disclosed technology provided in the independent claims. Advantageous implementations are defined in the dependent claims.

A first aspect of the disclosed technology provides a stack for a MRAM device, the stack comprising: a substrate layer having a [001] or [010] or [100] in-plane texture; a first electrode layer arranged on the substrate layer, the first electrode layer having a [001] or [010] or [100] in-plane texture; a seed metal layer arranged on the first electrode layer, the seed metal layer having a [001] or [010] or [100] in-plane texture; a magnetic free layer arranged on the seed metal layer; a crystalline tunnel barrier layer arranged on the free layer; a magnetic reference layer arranged on the crystalline tunnel barrier layer; a pinning layer arranged on the reference layer; and a second electrode layer arranged on the pinning layer.

Due to the above-described in-plane textures of the substrate layer, the first electrode layer, and the seed metal layer, respectively, the TMR of the stack can be improved, and can reach values of 200% and higher. Notably, in the disclosed technology, the TMR can be the ratio of a first tunneling magnetoresistance and a second tunneling magnetoresistance experienced when tunneling through the crystalline tunnel barrier layer. The first tunneling magnetoresistance can relate to the case where the free layer and the reference layer have opposite (anti-parallel) magnetization orientations, and the second tunneling magnetoresistance can relate to the case where the free layer and the reference layer have the same (parallel) magnetization orientations. The switchable magnetization of the free layer may represent stored information, while the magnetization of the reference layer is fixed.

The TMR increase may specifically be achieved in various implementations, because an [001] or [010] or [100] in-plane texture of the free layer is obtained as well. As a further consequence, the quality of the crystalline tunnel barrier layer can be also improved, which enhances the TMR of the stack.

A very high quality of the crystalline tunnel barrier layer may be achieved by annealing during the fabrication of the stack, for example, after the tunnel barrier layer is formed and before the reference layer is formed, as described in more detail later. The enhanced crystallinity of the tunnel barrier layer can increase the TMR for the stack. The tunnel barrier layer may notably also have a [001] or [010] or [100] in-plane texture.

The stack of the first aspect can be a top-pinned stack, since the reference layer can be arranged above the free layer, wherein "above" can be defined along a direction away from the substrate layer in the disclosed technology. For example, a first layer that is arranged "above" or "on" (e.g., meaning directly on in various implementations) a second layer, can be more distanced from the substrate layer than the second layer. The direction away from the substrate layer may be referred to as the stacking direction of the layers of the stack, or may be referred to as a vertical direction (as illustrated in the example figures), and may be perpendicular to the surfaces of the layers of the stack.

In an implementation of the stack, the substrate layer comprises at least one of a magnesium oxide layer, a magnesium-oxide-based layer, and a [001] or [010] or [100] in-plane conductive or dielectric layer; and the conductive or dielectric layer comprises at least one of a magnesium titanium oxide layer, a magnesium titanate layer, a magnesium dititanate layer, a magnesium gallate layer, and a nickel aluminide layer.

For instance, the substrate layer may comprise or consist of one or more magnesium based alloys. The substrate layer may, beneficially, act as a template to provide the [001] or [010] or [100] in-plane texture to the further layers of the stack. Thus, the substrate layer may also be referred to as template layer in the disclosed technology.

In an implementation of the stack, the first electrode layer comprises at least one of a titanium nitride layer, a chromium layer, and a tantalum nitride layer.

In an implementation of the stack, the seed metal layer comprises at least one of a tungsten layer, a molybdenum layer, a niobium nitride layer, and a tantalum layer.

In an implementation of the stack, at least one of the free layer and the reference layer comprises an iron-based layer; and/or at least one of the free layer and the reference layer comprises at least one of the following: one or more iron layers; one or more iron boron layers; one or more cobalt iron boron layers; one or more cobalt iron layers; one or more cobalt iron carbon layers; one or more cobalt iron carbon boron layers; and one or more cobalt boron layers.

The material selection and/or process of fabrication of the first electrode layer, the seed layer, and/or the free layer, respectively, may be beneficial for several reasons. For instance, the selected materials may support a well-defined in-plane texture and higher quality of the free layer. Further, the selected materials may allow the use of higher thermal budgets during the fabrication of the stack, which may lead to a better quality of the crystalline tunnel barrier layer, and may improve the PMA of the free layer.

In an implementation of the stack, the free layer comprises at least two layers with respectively an amorphizing dopant, wherein the two layers have different contents of the amorphizing dopant. In addition, the two layers may have different types of amorphizing dopants, for instance, selected from boron, carbon, or both.

For example, a higher boron content in the free layer may be beneficial to reach a higher TMR after a (e.g., high temperature) thermal treatment, which is performed after forming the tunnel barrier layer and before forming the reference layer, since crystallization of the tunnel barrier layer can be delayed. On the other hand, a lower boron content may be beneficial in the reference layer, in order to allow a lower thermal budget after fabricating the full stack, and thus to reach higher TMR. In an implementation, it is also possible to use no boron at all in the reference layer and/or to use another amorphizing dopant.

Two layers (e.g., a double-layer) are beneficial for both the free layer and the reference layer. For instance, a first layer of the double-layer may be made of pure iron, while a second layer of the double-layer may be a magnetic alloy with a lattice match [e.g., ±5%] with an MgO or MgO-based alloy. The amorphizing dopant type and content might be different for the free layer and the reference layer.

In an implementation of the stack, the free layer has a [001] or [010] or [100] in-plane texture; and/or the free layer comprises one or more spacer material layers to enhance (e.g., increase a degree of) the [001] or [010] or [100] in-plane texture and/or to act (e.g., serve) as diffusion barrier.

This in-plane texture of the free layer can improve the quality of the tunnel barrier layer, hence, can further improve the TMR.

In an implementation of the stack, the crystalline tunnel barrier layer has a [001] or [010] or [100] in-plane texture; and/or an interface between the crystalline tunnel barrier layer and the free layer is formed by a magnesium-oxide-layer to an iron-layer interface.

This may lead to a further improved TMR of the stack.

In an implementation of the stack, the free layer and the reference layer have each a thickness in a range of 0.1-3.0 nanometer; and/or the seed metal layer has a thickness in a range of 0.05-100 nanometer; and/or the substrate layer has a thickness in a range of 0.05-200 nanometer; and/or the first electrode layer has a thickness in a range of 1-200 nanometer; and/or the crystalline tunnel barrier layer has a thickness in a range of 0.5-5 nanometer.

These thicknesses and dimensions have proven to be beneficial for increasing the TMR of the stack in various implementations.

In an implementation of the stack, the pinning layer comprises a synthetic antiferromagnet (SAF) layer, and optionally comprises a spacer layer arranged on the reference layer.

The SAF layer and spacer layer can be annealed at lower safe anneal temperatures that reduces eventual metal diffusion through the stack, and PMA loss of the reference layer.

A second aspect of the disclosed technology provides an MRAM device comprising one or more stacks, wherein each stack can be designed according to the stack of the first aspect or any implementation of the first aspect.

The MRAM device of the second aspect can enjoy the advantages of the stack of the first aspect. The improved TMR of the stack can enhance the performance of the MRAM device.

A third aspect of the disclosed technology provides a method of fabricating a stack for an MRAM device, the method comprising: forming a substrate layer having a [001] or [010] or [100] in-plane texture; forming a first electrode layer on the substrate layer, the first electrode layer having a [001] or [010] or [100] in-plane texture; forming a seed metal layer on the first electrode layer, the seed metal layer having a [001] or [010] or [100] in-plane texture; forming a magnetic free layer on the seed metal layer; forming a tunnel barrier layer on the free layer; performing a first anneal at a temperature in a range of 400-500° C. or higher, whereby the tunnel barrier layer becomes crystalline; forming a magnetic reference layer on the crystalline tunnel barrier layer, after performing the first anneal; forming a pinning layer on the reference layer; and forming a second electrode layer on the pinning layer.

The method of the third aspect can be used to fabricate a stack, which can enjoy the advantages described above with respect to the stack of the first aspect. The method may accordingly fabricate a stack with a higher TMR than that of other stacks.

The method can enable decoupling thermal budgets during the fabrication of the stack. For example, a higher thermal budget can be provided by performing the first anneal, after the tunnel barrier layer is formed and before the reference layer is formed. A lower thermal budget anneal can be performed at a later stage of the fabrication method. The first anneal can lead to a crystalline and/or higher quality tunnel barrier layer, which enhances the TMR of the stack. The first anneal may obtain a [001] or [010] or [100] in-plane textured crystalline tunnel barrier layer, which is, for example, made from MgO. In addition, the reference layer can be deposited on a high-quality crystalline tunnel barrier layer, which has additional benefits with respect to the TMR.

Some stacks are fabricated using one anneal after fabricating the whole stack. In such stacks, a tunnel barrier crystallization may not occur at all or with lower quality due to not improved (e.g., optimal) texture, and may happen only during annealing the full stack, impacting also the reference layer and the free layer, which lowers the TMR. Further, in some top-pinned stacks, the reference layer may be deposited on an amorphous tunnel barrier layer.

In an implementation, the method further comprises performing a second anneal at a temperature in a range of 300-400° C. or lower, after forming the second electrode layer.

The second anneal may use a lower temperature than the first anneal. The thermal budgets of the two anneals can be decoupled in the method. While the higher thermal budget of the first anneal may lead to an improved crystalline quality of the tunnel barrier layer as explained above, the lower thermal budget second anneal may avoid PMA loss in the reference layer and/or the free layer, and may also prevent metal diffusion through the stack.

In an implementation, the method further comprises performing a third anneal after forming the seed layer and before forming the free layer.

This third anneal may further improve the TMR of the stack.

In an implementation of the method, the stack can be designed according to any implementation of the stack of the first aspect. Accordingly, the method can be used to fabricate the stack according to the first aspect as such or any of its implementations.

The disclosed technology can address a significant challenge of MRAM devices and stacks for MRAM devices, for example, for STT-MRAM devices, such as the hard TMR/RA limits that can be reached with some stacks and their fabrication methods. The MTJ first approach can be employed in the disclosed technology, and based thereon a method can be provided to decouple the maximum thermal budgets for the MTJ on the one hand side (e.g., comprising the seed layer, the free layer, and the tunnel barrier layer), and the reference layer, the pinning layer on the other hand side (e.g., the SAF layer).

Improvements of the in-plane textures of the first electrode layer, the seed metal layer, and the free layer, and an enhanced thermal stability of these layers, can allow setting the framework for an improved quality and/or crystallinity of the crystalline tunnel barrier layer, which may be achieved by the first anneal. In various implementations, the TMR of the MTJ of the stack can thus be significantly improved to values beyond 200%.

BRIEF DESCRIPTION OF THE DRAWINGS

The above described aspects and implementations are further explained in the following description of example embodiments with respect to the drawings, wherein:

FIGS. 4A-1 and 4A-2 show TEM images of stacks on different first electrodes with the MTJ first approach; and FIGS. 4B-1 and 4B-2 show an XRD analysis of an MgO substrate layer, a first electrode layer, and an iron layer of a stack of the disclosed technology; and FIGS. 4C-1 and 4C-2 show HR-TEM images respectively comparing the MTJ first approach with a bottom-pinned stack.

DETAILED DESCRIPTION OF CERTAIN ILLUSTRATIVE EMBODIMENTS

Figure 1:
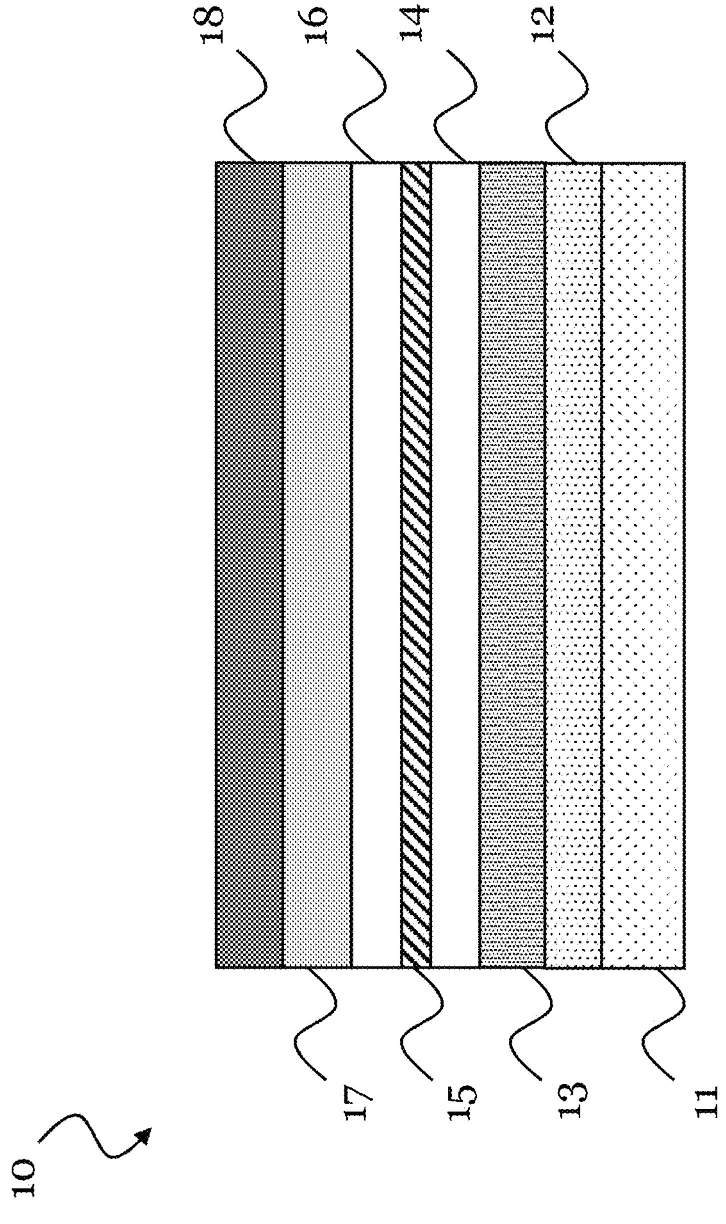
FIG. 1 shows a stack for an MRAM device according to the disclosed technologies.

FIG. 1 shows a stack 10 for an MRAM device according to the disclosed technology. The MRAM device may comprise one or more such stacks 10. For instance, the MRAM device may include at least one such stack 10 for/in each memory cell of multiple memory cells of the MRAM device. The MRAM device of the disclosed technology may be a STT-MRAM device. Accordingly, the stack 10 may be for or of a STT-MRAM device.

The stack 10 comprises a substrate layer 11, a first electrode layer 12 provided on the substrate layer 11, and a seed metal layer 13 provided on the first electrode layer 12. These layers 11, 12, 13 each have a [001] or [010] or [100] in-plane texture.

The substrate layer 11 may be or comprise a conductive layer or a dielectric layer. For instance, the conductive or dielectric layer may comprise a magnesium titanium oxide layer ($MgTi_2O_4$ layer), a magnesium titanate layer ($MgTiO_3$ layer), a magnesium dititanate layer ($MgAl_2O_4$ layer), a magnesium gallate layer ($MgGa_2O_4$ layer), or a nickel aluminide layer (NiAl layer). The substrate layer 11 may also be or comprise a magnesium oxide based layer, for example, a $Mg_xO_yX_z$ layer, wherein X is selected from the list of: Ti, V, Cr, Mn, Fe, Co, Ni, Cu, Zn, Zr, Nb, Mo, Tc, Ru, Rh, Pd, Ag, Cd, Hf, Ta, W, Re, Os, Ir, Pt, Au, Al, Ga, Ge, In, Sn, Sb, Pb, and Bi, and wherein x, y and z are numbers. An example for the substrate layer 11 is $(Mg_{0.2}Ti_{0.8})O$.

The first electrode layer 12 may be or comprise a titanium nitride layer (TiN layer), a chromium layer (Cr layer), or a tantalum nitride layer (TaN layer).

The seed metal layer 13 may be or comprise a tungsten layer (W layer), a molybdenum layer (Mo layer), a niobium nitride layer (NbN layer), or a tantalum layer (Ta layer). It may have a function of seeding the next layer.

The stack 10 can further comprise an MTJ, wherein the MTJ comprises a magnetic free layer 14 provided on the seed metal layer 13, a crystalline tunnel barrier layer 15 provided on the magnetic free layer 14, and a magnetic reference layer 16 provided on the crystalline tunnel barrier layer 15.

The free layer 14 and/or the reference layer 16 may each comprise at least one of the following: an iron layer (Fe layer), an iron boron layer (FeB layer), a cobalt iron boron layer (CoFeB layer), a cobalt iron layer (CoFe layer), a cobalt iron carbon layer (CoFeC layer), a cobalt iron carbon boron layer (CoFeCB layer), and a cobalt boron layer (CoB layer).

The tunnel barrier layer 15 may comprise a crystalline magnesium oxide layer (MgO layer) and/or magnesium based oxide layer. The crystalline tunnel barrier layer 15 may have a [001] or [010] or [100] in-plane crystal texture.

Figure 2:
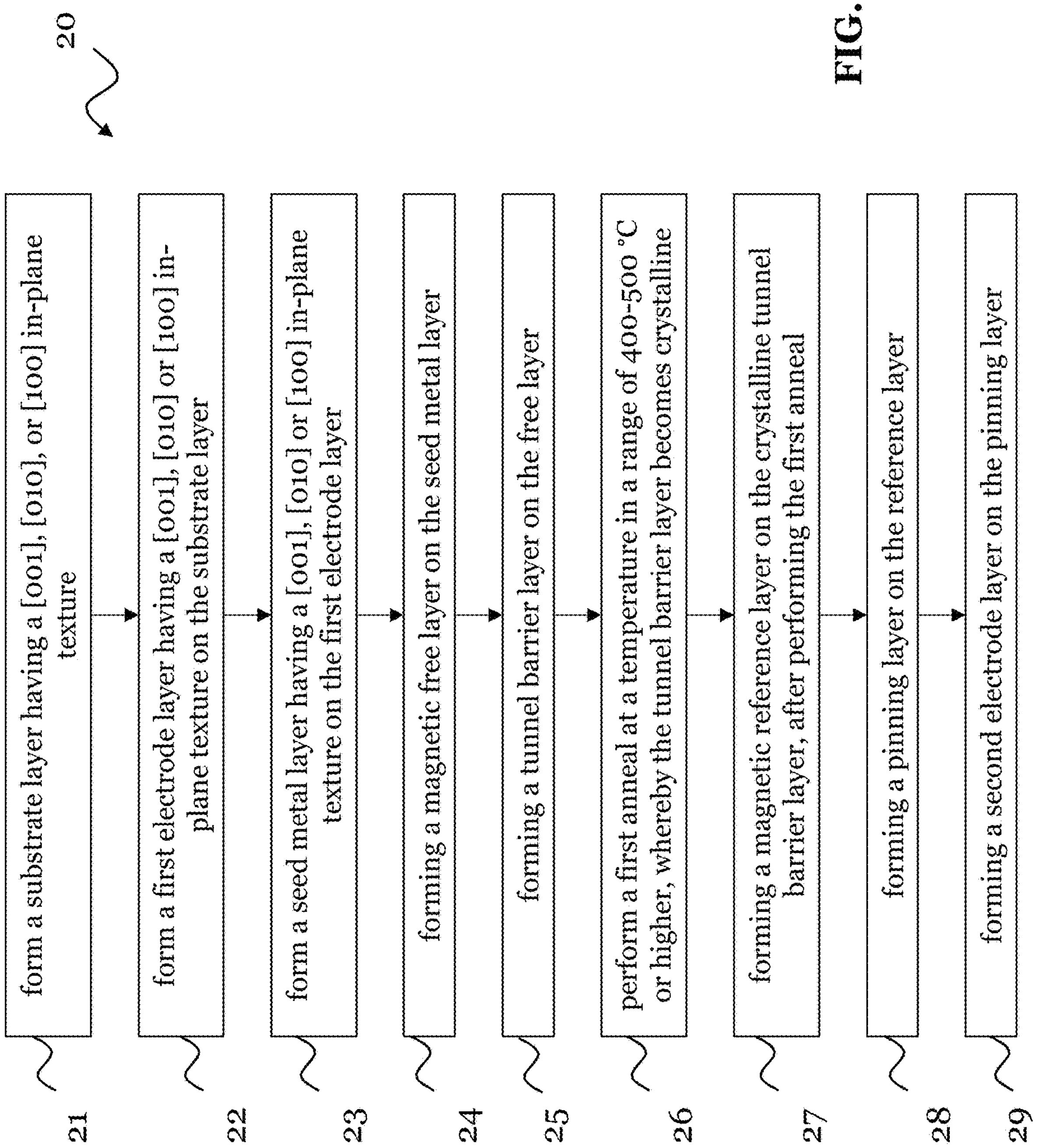
FIG. 2 shows a method of fabricating a stack for an MRAM device according to the disclosed technology.

FIG. 2 shows a flow-diagram of a method 20 of fabricating a stack for an MRAM device according to the disclosed technology, in particular, for fabricating the stack 10 shown in FIG. 1. The method 20 comprises forming the various layers of the stack 10 described above, for example, operational blocks 22, 23, 24, 25, 27, 28 and 29. Beneficially, the method can also comprise performing a first anneal at a temperature in a range of 400-500° C. or higher as shown in operational block 26. As can be seen, the first anneal 26 can be performed after forming the tunnel barrier layer 15, and before forming the reference layer 16. Due to this first anneal 26, the tunnel barrier layer 15 formed in operational block 25 can become crystalline and/or can be provided with an improved crystalline quality. This improves the TMR of the stack 10 in various implementations. The method 20 may comprise further operational blocks of performing one or more additional anneals, as described later.

Figure 3B:
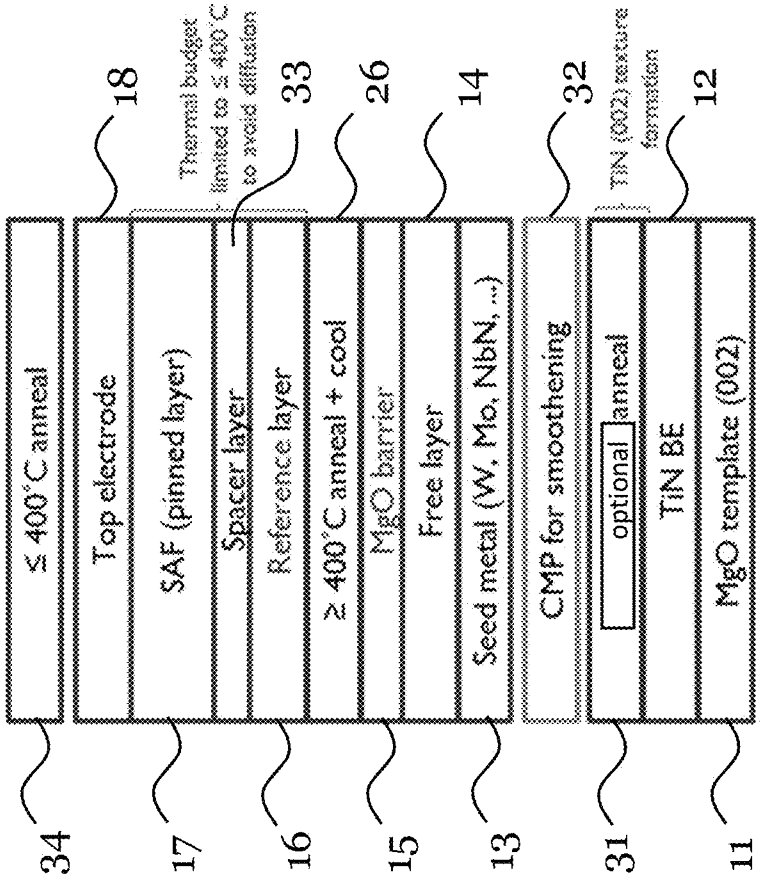
FIGS. 3A and 3B compare respectively one solution (stack and method) with an example solution of the disclosed technology.
Figure 3A:
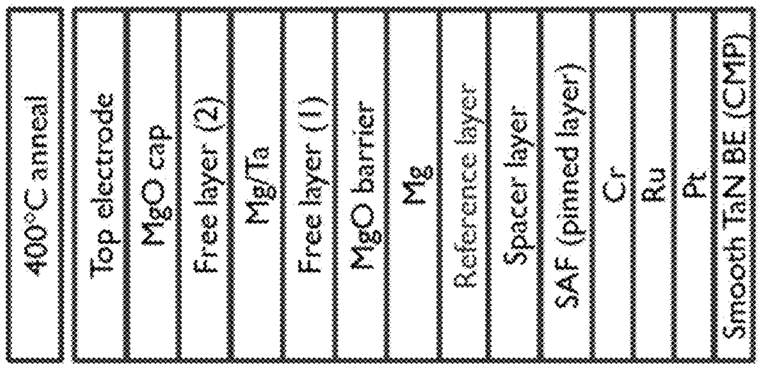

FIGS. 3A and 3B respectively show a comparison of one solution for stack and an example solution of the disclosed technology for the stack 10 and method 20. The first solution shown in FIG. 3A is a bottom-pinned stack and suffers from high thermal budgets experienced by the entire stack. Also some top-pinned stacks suffer from high thermal budgets.

The example stack 10 shown in FIG. 3B includes an MgO template layer as the substrate layer 11, which has a [002] in-plane texture that corresponds to a [001] in plane-texture, and includes a TiN bottom electrode (BE) layer as the first electrode layer 12, which is arranged on the substrate layer 11. After forming the first electrode layer 12 on the substrate layer 11, an optional anneal may be performed. This optional anneal may be beneficial for the in-plane texture of the first electrode layer 12. Further, an optional chemical-mechanical polishing (CMP) may be performed, which may reduce the roughness and thus enhance the quality of the following layers and the layer interfaces of the stack 10, thus also improving the TMR.

The example stack 10 of FIG. 3B further includes the seed metal layer 13 (for example, comprising a W, Mo, or NbN layer) arranged on the first electrode layer 12, and potentially formed after performing the optional CMP. The stack 10 further includes the magnetic free layer 14 (e.g., comprising a CoFeB layer or any material mentioned above) provided on the seed metal layer 13, and includes the tunnel barrier layer 15 made of MgO and/or MgO based oxide layer, which is arranged on the free layer 14. After forming the tunnel barrier layer 15, the first anneal 26 also shown in FIG. 2 may be performed, for instance, at a temperature of 400° C. or more. Afterwards, the intermediate stack formed up to this point may be allowed to cool down, before forming the next layer(s). The cool-down can allow avoiding diffusion during the later pinning layer deposition.

The exemplary stack 10 of FIG. 3B further includes the magnetic reference layer 16 (e.g., a CoFeB layer or any material mentioned above) provided on the MgO and/or MgO based oxide tunnel barrier layer 15 and formed after the first anneal 26, further includes a spacer layer 33 provided on the reference layer 16, further includes a SAF layer as the pinning layer 17, and also includes the second electrode layer 18 (e.g., a TiN, TaN, Ta/Ru layer or another metal layer) provided on the pinning layer 17. After forming the pinning layer 18, a second anneal 34 is performed at a temperature≤400° C., for example, in a range of 300-400° C. or lower. Due to the separation of the two anneals 26 and 34, the thermal budget experienced by the reference layer 16, the spacer layer 33, and the pinning layer 17 can be limited. This may reduce and/or avoid that metals diffuse much and far in the stack 10, and may thus reduce and/or prevent the stack 10 from suffering performance loss due to TMR reduction. The thermal budget experienced by the tunnel barrier layer 15 can be higher and can promote its crystallinity.

With the method(s) 20 and stack(s) 10 presented in the disclosed technology, a high TMR of 200% or more at a low RA of ~4.5 Ohms·μm$^2$, or even 240% or more at a low RA of ~10 Ohm·μm$^2$ may be obtained. The MTJ first approach (top-pinned stack) can be used in the disclosed technology, and the maximum thermal budget for the tunnel barrier layer 15 of the MTJ (the first anneal 26) and respectively for the SAF pinning layer 17 (the second anneal 34) can be decoupled.

The first electrode layer 12, the seed layer 13, and the free layer 14 may be improved and/or optimized by material selection and/or process of fabrication, in order to improve the TMR of the stack 10. For instance, the choice of the materials for the first electrode layer 12 and the seed layer 13, can enable the forming of an improved free layer 14. For instance, an improved (Co)Fe [100] in-plane texture of the free layer 14 can be obtained. An improved free layer 14 can result in an improved tunnel barrier layer quality (e.g., higher quality crystalline MgO), and thus a higher TMR. The choice of the materials for the seed layer 13 and the free layer 14 can enable the higher thermal budgets of the first anneal 26, while maintaining the PMA of the free layer. The high thermal budget can enhance the tunnel barrier layer crystallization and its interfaces to the free layer 14 and reference layer 16, respectively, and consequently can enhance the TMR. In addition, an improved breakdown and switching performance may be achieved due to the improved crystallinity of the tunnel barrier layer 15.

In the stacks 10 shown in FIG. 1 and FIG. 3B, the layers may have the following thicknesses, wherein "thickness" in this disclosure can be measured into the stacking direction of the layers of the stack 10. The free layer 14 and the reference layer 16 may respectively have a thickness in a range of 0.1-3.0 nanometer. The seed metal layer 13 may have a thickness in a range of 0.05-100 nanometer. The substrate layer 11 may have a thickness in a range of 0.05-200 nanometer. The first electrode layer 12 may have a thickness in a range of 1-200 nanometer. The crystalline tunnel barrier layer 15 may have a thickness in a range of 0.5-5 nanometer.

Figures 1, 4A:
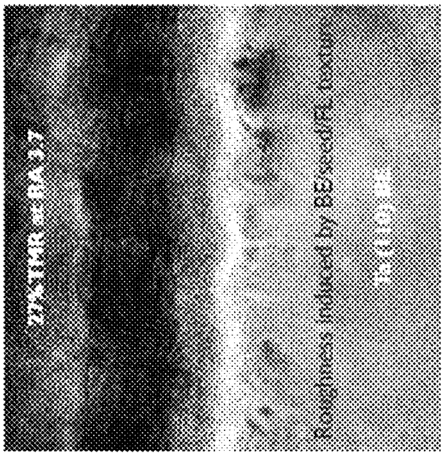
Figures 2, 4A:
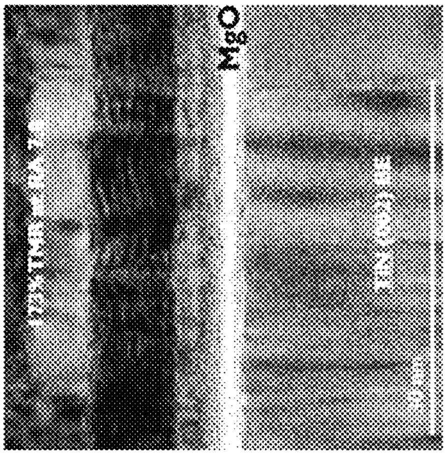

FIGS. 4A-1 and 4A-1 show transmission electron microscopy (TEM) images of MTJs of stacks, wherein the MTJs are formed on different (first) electrode layers after CMP, and wherein both stacks are formed with the MTJ first approach. The left-side TEM image in FIG. 4A-1 is of a MTJ arranged on a Ta electrode having a [110] in-plane texture, while the right-side TEM image in FIG. 4A-2 is of a MTJ arranged on a TiN electrode with a [002] in-plane texture as proposed by the disclosed technology. It can be seen that for the right-side case in FIG. 4A-2, the layers and interfaces of the stack are of much higher quality, which leads to higher TMR of the MTJ.

Figures 1, 4B:
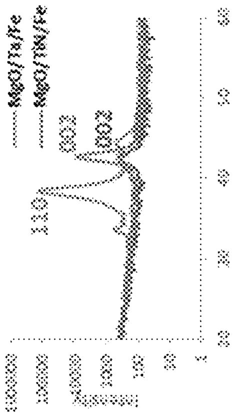
Figures 2, 4B:
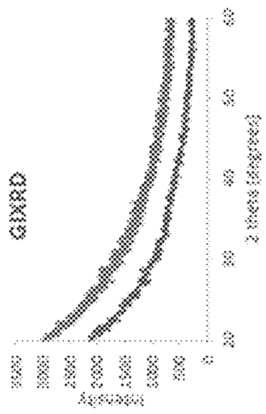

FIGS. 4B-1 and 4B-2 show further an XRD analysis of only an MgO substrate layer, of a stack comprising a Ta electrode layer on the MgO substrate layer and an iron layer on the Ta electrode layer, and a part of a stack 10 of the disclosed technology comprising a TiN electrode layer on the MgO substrate layer and an iron layer on the TiN electrode layer. For the improved textured first electrode layer a peak associated with a [002] in-plane texture is revealed. Notably, in each case the electrode layer was CMP smoothed, the iron layer has a 5 nanometer thickness.

Figures 1, 4C:
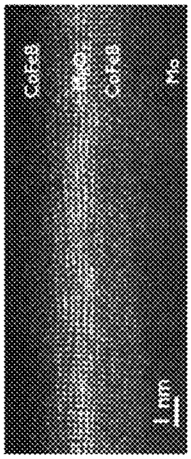
Figures 2, 4C:
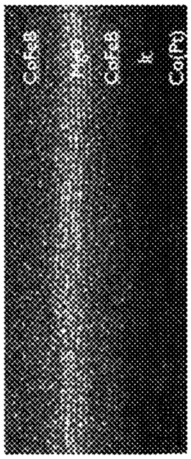

FIGS. 4C-1 and 4C-2 show further high resolution TEM (HR-TEM) images, which demonstrate the improved MgO texture achieved with the MTJ first approach in FIG. 4C-1 (left image) compared to the bottom pinned stack in FIG. 4C-2 (right image).

In the claims as well as in the description of this disclosure, the word "comprising" does not exclude other elements or steps and the indefinite article "a" or "an" does not exclude a plurality. A single element may fulfill the functions of several entities or items recited in the claims. The mere fact that certain measures are recited in the mutual different dependent claims does not indicate that a combination of these measures cannot be used in an advantageous implementation.

What is claimed is:

1. A stack for a magnetoresistive random-access memory device, the stack comprising:

a substrate layer having a [001] or [010] or [100] in-plane texture;

a first electrode layer arranged on the substrate layer, the first electrode layer having a [001] or [010] or [100] in-plane texture;

a seed metal layer arranged on the first electrode layer, the seed metal layer having a [001] or [010] or [100] in-plane texture;

a magnetic free layer arranged on the seed metal layer;

a crystalline tunnel barrier layer arranged on the magnetic free layer;

a magnetic reference layer arranged on the crystalline tunnel barrier layer;

a pinning layer arranged on the magnetic reference layer; and a second electrode layer arranged on the pinning layer.

2. The stack of claim 1, wherein:

the substrate layer comprises at least one of a magnesium oxide layer, a magnesium-oxide-based layer, and a conductive or dielectric layer having a [001] or [010] or [100] in-plane texture; and the conductive or dielectric layer comprises at least one of a magnesium titanium oxide layer, a magnesium titanate layer, a magnesium dititanate layer, a magnesium gallate layer, and a nickel aluminide layer.

3. The stack of claim 1, wherein the first electrode layer comprises at least one of a titanium nitride layer, a chromium layer, and a tantalum nitride layer.

4. The stack of claim 1, wherein:

the seed metal layer comprises at least one of a tungsten layer, a molybdenum layer, a niobium nitride layer, and a tantalum layer.

5. The stack of claim 1, wherein:

at least one of the magnetic free layer and the magnetic reference layer comprises an iron-based layer; and/or at least one of the magnetic free layer and the magnetic reference layer comprises at least one of the following:

one or more iron layers;

one or more iron boron layers;

one or more cobalt iron boron layers;

one or more cobalt iron layers;

one or more cobalt iron carbon layers;

one or more cobalt iron carbon boron layers; and one or more cobalt boron layers.

6. The stack of claim 5, wherein the magnetic free layer comprises at least two layers each comprising an amorphizing dopant, wherein the two layers have different contents of the amorphizing dopant.

7. The stack of claim 6, wherein the amorphizing dopant comprises boron, carbon, or both.

8. The stack of claim 1, wherein:

the magnetic free layer has a [001] or [010] or [100] in-plane texture; and/or the magnetic free layer comprises one or more spacer material layers to increase a degree of the [001] or [010] or [100] in-plane texture and/or to serve as diffusion barrier.

9. The stack of claim 1, wherein:

the crystalline tunnel barrier layer has a [001] or [010] or [100] in-plane texture; and/or an interface between the crystalline tunnel barrier layer and the magnetic free layer is formed by a magnesium-oxide-layer and an iron-layer.

10. The stack of claim 1, wherein:

the magnetic free layer and the magnetic reference layer have each a thickness in a range of 0.1-3.0 nanometer; and/or the seed metal layer has a thickness in a range of 0.05-100 nanometer; and/or the substrate layer has a thickness in a range of 0.05-200 nanometer; and/or the first electrode layer has a thickness in a range of 1-200 nanometer; and/or the crystalline tunnel barrier layer has a thickness in a range of 0.5-5 nanometer.

11. The stack of claim 1, wherein the pinning layer comprises a synthetic antiferromagnet layer.

12. The stack of claim 11, wherein the pinning layer further comprises a spacer layer arranged on the magnetic reference layer.

13. A magnetoresistive random-access memory device comprising one or more stacks, wherein at least one of the one or more stacks includes the stack of claim 1.

14. A method of fabricating the stack of claim 1 for a magnetoresistive random-access memory device, the method comprising:

forming the substrate layer having a [001] or [010] or [100] in-plane texture;

forming the first electrode layer on the substrate layer;

forming the seed metal layer on the first electrode layer;

forming the magnetic free layer on the seed metal layer;

forming a tunnel barrier layer on the magnetic free layer;

performing a first anneal at a temperature in a range of 400-500° C. or higher to crystallize the tunnel barrier layer;

forming the magnetic reference layer on the crystalline tunnel barrier layer, after performing the first anneal;

forming the pinning layer on the magnetic reference layer; and forming the second electrode layer on the pinning layer.

15. The method of claim 14, wherein the method further comprises performing a second anneal at a temperature in a range of 300-400° C. or lower, after forming the second electrode layer.

16. The method of claim 15, wherein the method further comprises performing a third anneal after forming the seed layer and before forming the magnetic free layer.

17. The method of claim 14, wherein the substrate comprises at least one of a magnesium oxide layer, a magnesium-oxide-based layer, and conductive or dielectric layer having a [001] or [010] or [100] in-plane texture.

18. The method of claim 17, wherein the conductive or dielectric layer comprises at least one of a magnesium titanium oxide layer, a magnesium titanate layer, a magnesium dititanate layer, a magnesium gallate layer, and a nickel aluminide layer.

19. The method of claim 14, wherein:

the magnetic free layer has a [001] or [010] or [100] in-plane texture; and/or the magnetic free layer comprises one or more spacer material layers to increase a degree of the [001] or [010] or [100] in-plane texture and/or to serve as diffusion barrier.

20. The method of claim 14, wherein:

the crystalline tunnel barrier layer has a [001] or [010] or [100] in-plane texture; and/or an interface between the crystalline tunnel barrier layer and the magnetic free layer is formed by a magnesium-oxide-layer and an iron-layer.

* * * * *